(12) United States Patent
Cheng

(10) Patent No.: US 12,349,377 B2
(45) Date of Patent: Jul. 1, 2025

(54) PREPARATION METHOD FOR SEMICONDUCTOR STRUCTURE INVOLVING THE REPLACEMENT OF DIELECTRIC LAYER WITH GATE

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 490 days.

(21) Appl. No.: 17/526,321

(22) Filed: Nov. 15, 2021

(65) Prior Publication Data

US 2022/0102530 A1 Mar. 31, 2022

Related U.S. Application Data

(63) Continuation of application No. PCT/CN2019/087262, filed on May 16, 2019.

(51) Int. Cl.
*H10D 30/01* (2025.01)
*H01L 21/225* (2006.01)
(Continued)

(52) U.S. Cl.
CPC ....... *H10D 30/015* (2025.01); *H01L 21/2258* (2013.01); *H01L 21/3245* (2013.01); *H10D 30/475* (2025.01); *H10D 62/60* (2025.01)

(58) Field of Classification Search
CPC ......... H01L 29/66462; H01L 29/66431; H01L 21/2258; H01L 21/3245; H01L 21/28; H01L 21/3006; H10D 30/015; H10D 30/475; H10D 62/60; H10D 62/8503; H10D 64/256; H10D 64/411; H10D 62/343

See application file for complete search history.

(56) References Cited

U.S. PATENT DOCUMENTS

| 5,701,019 A | 12/1997 | Matsumoto et al. |
| 2009/0162999 A1* | 6/2009 | Lin ............... H01L 21/0254 438/483 |

(Continued)

FOREIGN PATENT DOCUMENTS

| CN | 103337516 A | 10/2013 |
| CN | 108346695 A | 7/2018 |

(Continued)

OTHER PUBLICATIONS

First Office Action issued in counterpart Chinese Patent Application No. 201980096456.3, dated Apr. 27, 2022.
(Continued)

*Primary Examiner* — William B Partridge
*Assistant Examiner* — David Paul Sedorook
(74) *Attorney, Agent, or Firm* — Westbridge IP LLC

(57) ABSTRACT

According to the preparation method for a semiconductor structure provided in the present application, a selective epitaxial growth method is used, without etching the n-type semiconductor layer and the p-type semiconductor layer, thus avoiding problems such as uncontrollable etching depth and damaged etched surface, which effectively reduces gate leakage, maintains low resistance in a channel region, suppresses current collapse, and improves reliability and stability of a device.

13 Claims, 3 Drawing Sheets

(51) Int. Cl.
  *H01L 21/324* (2006.01)
  *H10D 30/47* (2025.01)
  *H10D 62/60* (2025.01)

(56) References Cited

U.S. PATENT DOCUMENTS

| | | | |
|---|---|---|---|
| 2009/0212325 A1 | 8/2009 | Sato | |
| 2012/0211760 A1* | 8/2012 | Yamada | H01L 21/0254 |
| | | | 257/E21.403 |
| 2014/0264379 A1* | 9/2014 | Kub | H01L 29/7782 |
| | | | 257/77 |
| 2015/0021662 A1* | 1/2015 | Basu | H01L 29/7784 |
| | | | 438/285 |
| 2016/0211357 A1 | 7/2016 | Hung et al. | |
| 2017/0278961 A1* | 9/2017 | Hill | H01L 21/26546 |
| 2017/0309712 A1* | 10/2017 | Yamada | H01L 21/02458 |
| 2018/0090911 A1* | 3/2018 | Ryou | H01L 29/7845 |
| 2019/0097034 A1* | 3/2019 | Nakata | H01L 21/0254 |
| 2019/0311914 A1* | 10/2019 | Cheng | H01L 29/7786 |
| 2022/0140126 A1* | 5/2022 | LaRoche | H01L 29/7786 |
| | | | 257/183 |

FOREIGN PATENT DOCUMENTS

| | | |
|---|---|---|
| CN | 108565283 A | 9/2018 |
| CN | 108962752 A | 12/2018 |
| JP | 2011146613 A | 7/2011 |

OTHER PUBLICATIONS

International Search Report issued in corresponding PCT Application No. PCT/CN2019/087262, dated Jan. 19, 2020.

Written Opinion issued in corresponding PCT Application No. PCT/CN2019/087262, dated Jan. 19, 2020.

* cited by examiner

PREPARATION METHOD FOR SEMICONDUCTOR STRUCTURE INVOLVING THE REPLACEMENT OF DIELECTRIC LAYER WITH GATE

CROSS-REFERENCE TO RELATED APPLICATIONS

This application is a continuation of International Application No. PCT/CN2019/087262 filed on May 16, 2019, the disclosure of which is hereby incorporated by reference in its entirety.

TECHNICAL FIELD

This application relates to the field of microelectronics technologies, and in particular, to a preparation method for a semiconductor structure.

BACKGROUND

High Electron Mobility Transistor (HEMT) is a heterojunction field-effect transistor. Taking an AlGaN/GaN heterostructure as an example, since there is a strong two-dimensional electron gas in the AlGaN/GaN heterostructure, and an AlGaN/GaN HEMT is generally a depletion device, it is difficult to implement an enhancement-mode device. In addition, an application of a depletion device has certain limitations in many cases. For example, in an application of a power switching device, an enhancement-mode (normally-off mode) switching device is required. An enhancement-mode gallium nitride switching device is mainly used in a high-frequency device, a power switching device, a digital circuit or the like, and research into the enhancement-mode gallium nitride switching device is of great importance.

To implement the enhancement-mode gallium nitride switching device, it is necessary to find a suitable method to reduce concentration of a channel carrier under a gate when a gate voltage is zero, for example, by disposing a p-type semiconductor material in a gate region. However, the inventor found that this method has at least the following defects:

To dispose a p-type semiconductor material in a gate region, it is necessary to selectively etch the p-type semiconductor in other regions other than the gate, while it is difficult to control an etching process for precise thickness in an epitaxial direction, and it is easy to overetch the p-type semiconductor, and thus a semiconductor material below the p-type semiconductor is etched. In addition, the defects caused by etching will cause a serious current collapse effect, which will also affect stability and reliability of a device.

SUMMARY

In view of this, the present application provides a preparation method for a semiconductor structure, to avoid a current collapse effect and improve stability and reliability of a device, including:
sequentially preparing a channel layer, a barrier layer, and a p-type semiconductor layer on a substrate;
preparing a dielectric layer in a gate region above the p-type semiconductor layer;
preparing an n-type semiconductor layer in a region other than the gate region above the p-type semiconductor layer;
activating a p-type impurity in the p-type semiconductor layer covered by the dielectric layer, to form an active region.

In an embodiment of the present application, the preparation method for a semiconductor structure further includes: removing the dielectric layer, and preparing a gate above the active region of the p-type semiconductor layer.

In an embodiment of the present application, the preparation method for a semiconductor structure further includes: preparing a source and a drain respectively in two sides of the gate region, and the source and the drain penetrate the n-type semiconductor layer and the p-type semiconductor layer.

It may be understood that a preparation sequence of the source, the drain and the gate is not limited in the present application.

According to the preparation method for a semiconductor structure provided in the present application, a selective epitaxial growth method is used, without etching the n-type semiconductor layer and the p-type semiconductor layer, thus avoiding problems such as uncontrollable etching depth and damaged etched surface, which effectively reduces gate leakage, maintains low resistance in a channel region, suppresses current collapse, and improves reliability and stability of a device.

DETAILED DESCRIPTION OF THE EMBODIMENTS

The following describes the present application in detail with reference to specific implementations corresponding to the accompanying drawings. However, the present application is not limited to these implementations, and the structural, method, or functional changes made by those of ordinary skill in the art according to these implementations are all included in the protection scope of the present application.

In addition, repeated reference signs or marks may be used in different embodiments. These repetitions are only to briefly and clearly describe the present application, and do not represent any relevance between different embodiments and/or structures discussed.

An embodiment of the present application provides a preparation method for a semiconductor structure, including the following specific steps.

Figure 1A:
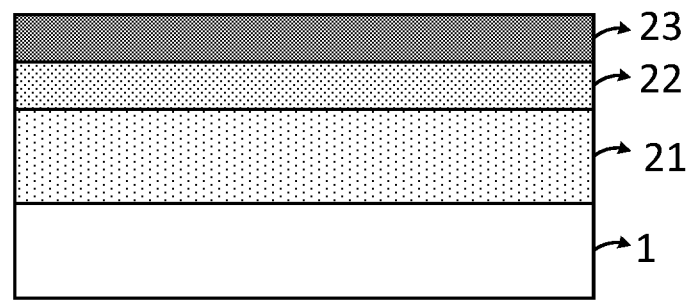
FIG. 1a-1b and FIG. 2-6 are respectively schematic exploded diagrams of a semiconductor structure in a preparing process according to an embodiment of the present application.

Step 1: as shown in FIG. 1a, sequentially preparing a channel layer 21, a barrier layer 22, and a p-type semiconductor layer 23 on a substrate 1.

The substrate 1 preferably includes sapphire, diamond, silicon carbide, silicon, lithium niobate, silicon on insulator (SOI), gallium nitride, or aluminum nitride.

The channel layer 21 and the barrier layer 22 may include a semiconductor material that can form a two-dimensional electron gas. The channel layer 21 and the barrier layer 22 may include, for example, a GaN-based material. The GaN-based material is a compound including at least a Ga atom and an N atom. For example, the channel layer 21 may include GaN, and the barrier layer 22 may include AlGaN. The channel layer 21 and the barrier layer 22 constitute a heterostructure, to form a two-dimensional electron gas.

The p-type semiconductor layer 23 includes a GaN-based material, for example, doping GaN with a p-type impurity, for example, Mg.

Figure 1B:
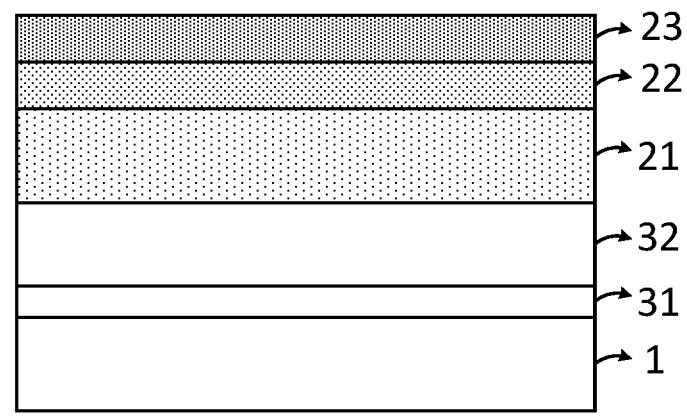

In an embodiment of the present application, as shown in FIG. 1b, before the channel layer 21 is grown, a nucleation layer 31 and a buffer layer 32 may also be grown sequentially on the substrate 1. Taking a GaN-based semiconductor structure as an example, the nucleation layer 31 may reduce dislocation density and defect density, improving crystal quality. The nucleation layer 31 may include one or more of AN, AlGaN, and GaN. The buffer layer 32 may buffer stress in an epitaxial structure above the substrate, preventing the epitaxial structure from cracking. The buffer layer 32 may include one or more of GaN, AlGaN, and AlInGaN.

The channel layer 21, the barrier layer 22, and the p-type semiconductor layer 23 may be grown in situ, or may be grown by Atomic Layer Deposition (ALD), Chemical Vapor Deposition (CVD), Molecular Beam Epitaxy (MBE), Plasma Enhanced Chemical Vapor Deposition (PECVD), Low Pressure Chemical Vapor Deposition (LPCVD), Metal-Organic Chemical Vapor Deposition (MOCVD), or a combination thereof. It should be understood that, for the formation of the channel layer 21 and the barrier layer 22 described herein, the channel layer, the barrier layer and the semiconductor layer may be formed by any method known to those skilled in the art in the present application.

Figure 2:
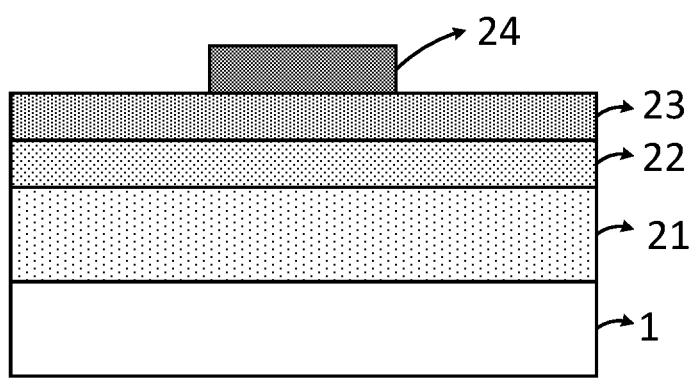

Step 2: as shown in FIG. 2, preparing a dielectric layer 24 in a gate region above the p-type semiconductor layer 23.

A dielectric layer is formed on the p-type semiconductor layer 23, and the dielectric layer in a region other than the gate region above the p-type semiconductor layer 23 is etched, so that the dielectric layer 24 is formed only in the gate region above the p-type semiconductor layer 23. The dielectric layer 24 covers the p-type semiconductor layer 23 under the gate region.

Figure 3:
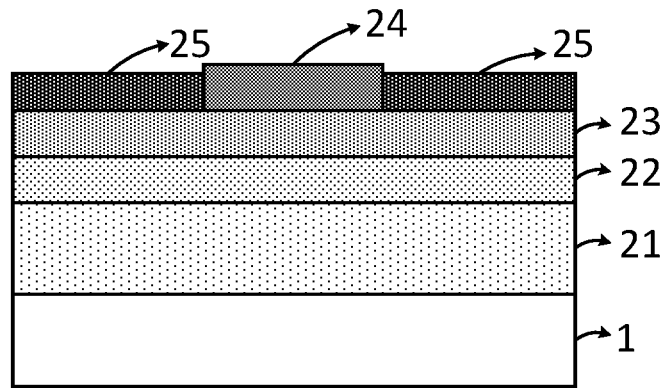

Step 3: as shown in FIG. 3, preparing an n-type semiconductor layer 25 in a region other than the gate region above the p-type semiconductor layer 23.

The n-type semiconductor layer 25 is selectively grown. The n-type semiconductor layer 25 is formed only in the region other than the gate region above the p-type semiconductor layer 23, and the n-type semiconductor layer 25 covers the p-type semiconductor layer 23 that is in the region other than the gate region.

Further, the n-type semiconductor layer includes an n-type GaN-based semiconductor layer, for example, an n-type impurity is doped in GaN to form n-GaN.

Figure 4:
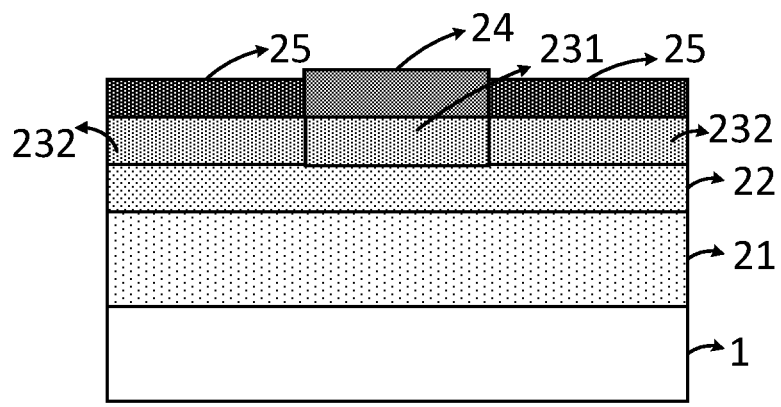

Step 4: as shown in FIG. 4, activating a p-type impurity in the p-type semiconductor layer covered by the dielectric layer 24, to form an active region 231.

In this embodiment, the epitaxial structure may be annealed to form an active region. The annealing includes performing annealing in a hydrogen-free environment. The p-type impurity in the p-type semiconductor layer 23 covered by the dielectric layer 24 is selectively activated to form the active region 231. For the p-type semiconductor layer 23 covered by the n-type semiconductor layer 25, due to blocking of the n-type semiconductor layer 25, H atoms cannot overflow, and the p-type impurity in the p-type semiconductor layer cannot be activated, forming an inactive region 232. It may be understood that a size of the active region 231 may be larger than that of the dielectric layer 24 covering the p-type semiconductor layer 23, may be less than that of the dielectric layer 24 covering the p-type semiconductor layer 23, or may be equal to that of the dielectric layer 24 covering the p-type semiconductor layer 23. A size of the active region 231 is not limited in the present application.

In this embodiment, a specific method for forming the active region 231 is that in a hydrogen-free annealing environment, the hydrogen component in the p-type semiconductor layer 23 overflows through the dielectric layer 24 to activate the p-type impurity in the p-type semiconductor layer 23. For the p-type semiconductor layer 23 covered by the n-type semiconductor layer 25, due to blocking of the n-type semiconductor layer 25, H atoms cannot overflow in the annealing environment but bond with the p-type impurity (such as Mg—H) in the p-type semiconductor layer, and the p-type impurity in the p-type semiconductor layer cannot be activated, forming the inactive region 232.

A material type of the dielectric layer is not specifically limited in the present application. The material type of the dielectric layer 24 only needs to meet the following requirements: in a process of activating the p-type impurity in the p-type semiconductor layer, overflow of H atoms is ensured. Specifically, after the active region 231 is formed, H content in the dielectric layer 24 may be, for example, not more than 10%. The dielectric layer may include, for example, at least one of $SiO_2$ and $Al_2O_3$.

Figure 5:
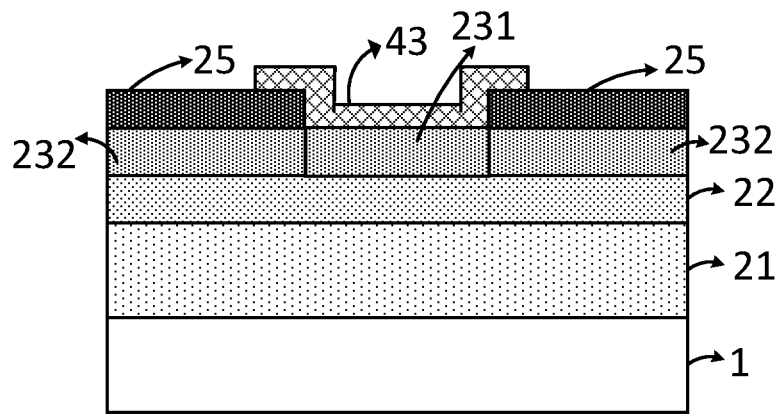

Step 5: as shown in FIG. 5, removing the dielectric layer 24, and preparing a gate 43 above the active region 231 of the p-type semiconductor layer 23.

The dielectric layer 24 may be removed by a wet etching method, and a gate material is deposited on a position where the dielectric layer 24 is removed, that is, above the active region 231, to form the gate 43.

Figure 6:
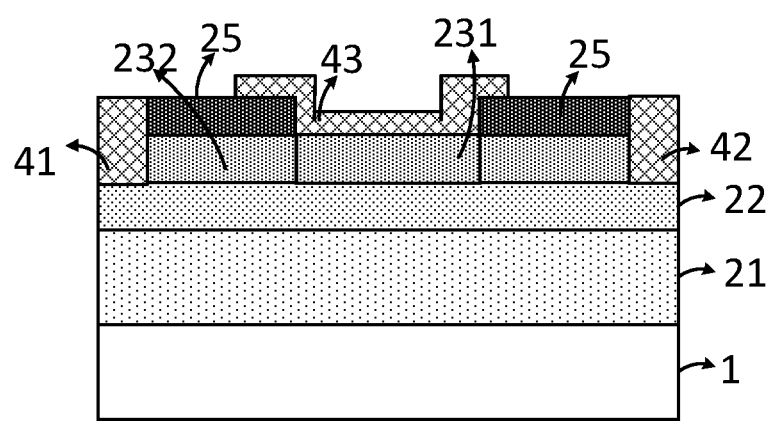

Further, the preparation method for a semiconductor structure further includes Step 6: as shown in FIG. 6, preparing a source 41 and a drain 42 respectively in a source region and a drain region, the source 41 and the drain 42 penetrate the n-type semiconductor layer and the p-type semiconductor layer.

Specifically, a groove can be formed by etching on two sides of the gate. The groove penetrates through the n-type semiconductor layer 25 and the inactive region 232 of the p-type semiconductor layer 23 and stops at the barrier layer 22. Metal is deposited in the groove to prepare the source and the drain, to form an ohmic contact.

Further, an etching method of the groove may be a dry etching method.

It may be understood that a sequence of Step 5 and Step 6 may be exchanged, that is, a sequence of preparation of the source, the gate, and the drain is not limited, as long as the gate, the source and the drain are formed on the epitaxial structure.

According to the preparation method for a semiconductor structure provided in the present application, a selective epitaxial growth method is used, without etching the n-type semiconductor layer and the p-type semiconductor layer, thus avoiding problems such as uncontrollable etching depth and damaged etched surface, which effectively reduces gate leakage, maintains low resistance in a channel region, suppresses current collapse, and improves reliability and stability of a device.

It should be understood that although this specification is described in accordance with the implementations, each implementation includes not only one independent technical solution. The description in the specification is only for clarity, and those skilled in the art should regard the specification as a whole. The technical solutions in the embodiments can also be appropriately combined to form other implementations that can be understood by those skilled in the art.

The series of detailed descriptions listed above are only specific descriptions of the feasible implementations of the present application. They are not used to limit the protection scope of the present application. Any equivalent implementation or change made without departing from the technical spirit of the present application shall fall within the protection scope of the present application.

What is claimed is:

1. A preparation method for a semiconductor structure, comprising:
   sequentially preparing a channel layer, a barrier layer, and a p-type semiconductor layer on a substrate;
   preparing a dielectric layer in a gate region of a first layer above the p-type semiconductor layer, a material of the dielectric layer comprising at least one of $SiO_2$ and $Al_2O_3$, a lower surface of the dielectric layer being in contact with an upper surface of the p-type semiconductor layer;
   preparing an n-type semiconductor layer in a region other than the gate region of the first layer above the p-type semiconductor layer by a selective epitaxial growth method, a lower surface of the n-type semiconductor layer being in contact with the upper surface of the p-type semiconductor layer, and the lower surface of the n-type semiconductor layer being in a same plane as the lower surface of the dielectric layer; and
   activating a p-type impurity in the p-type semiconductor layer covered by the dielectric layer, to form an active region, wherein when forming the active region, hydrogen component in the p-type semiconductor layer overflows through the dielectric layer to activate the p-type impurity in the p-type semiconductor layer, and for the p-type semiconductor layer covered by the n-type semiconductor layer, due to blocking of the n-type semiconductor layer, hydrogen component cannot overflow but bond with the p-type impurity in the p-type semiconductor layer, and the p-type impurity in the p-type semiconductor layer cannot be activated, forming an inactive region,
   wherein the preparing a dielectric layer in a gate region of a first layer above the p-type semiconductor layer comprises:
   forming a dielectric layer in the first layer above the p-type semiconductor layer; and
   etching the dielectric layer in a region other than the gate region of the first layer above the p-type semiconductor layer.

2. The preparation method for a semiconductor structure according to claim 1, further comprising: removing the dielectric layer, and preparing a gate above the active region of the p-type semiconductor layer.

3. The preparation method for a semiconductor structure according to claim 2, wherein the dielectric layer is removed by a wet etching method.

4. The preparation method for a semiconductor structure according to claim 1, further comprising: preparing a source and a drain respectively in a source region and a drain region, wherein the source and the drain penetrate the n-type semiconductor layer and the p-type semiconductor layer.

5. The preparation method for a semiconductor structure according to claim 1, wherein the preparing a source and a drain respectively in a source region and a drain region comprises:
   forming a groove by etching on two sides of a gate, wherein the groove penetrates through the n-type semiconductor layer and the p-type semiconductor layer, and stops at the barrier layer; and
   depositing metal in the groove to prepare the source and the drain.

6. The preparation method for a semiconductor structure according to claim 5, wherein an etching method of the groove is a dry etching method.

7. The preparation method for a semiconductor structure according to claim 1, wherein a method of forming the active region comprises annealing a semiconductor structure.

8. The preparation method for a semiconductor structure according to claim 7, wherein the annealing comprises performing annealing in a hydrogen-free environment.

9. The preparation method for a semiconductor structure according to claim 1, wherein the p-type semiconductor layer and the n-type semiconductor layer comprise a GaN-based semiconductor.

10. The preparation method for a semiconductor structure according to claim 1, wherein before preparing the channel layer, the preparation method further comprises:
    sequentially forming a nucleation layer and a buffer layer on the substrate.

11. The preparation method for a semiconductor structure according to claim 10, wherein the nucleation layer comprises one or more of AlN, AlGaN, and GaN.

12. The preparation method for a semiconductor structure according to claim 10, wherein the buffer layer comprises one or more of GaN, AlGaN, and AlInGaN.

13. The preparation method for a semiconductor structure according to claim 1, wherein the channel layer, the barrier layer and the p-type semiconductor layer are grown in situ, or be grown by Atomic Layer Deposition (ALD), Chemical Vapor Deposition (CVD), Molecular Beam Epitaxy (MBE), Plasma Enhanced Chemical Vapor Deposition (PECVD), Low Pressure Chemical Vapor Deposition (LPCVD), Metal-Organic Chemical Vapor Deposition (MOCVD), or a combination thereof.

* * * * *